United States Patent
Mizuta

[11] Patent Number: 6,056,627
[45] Date of Patent: May 2, 2000

[54] PROBE CLEANING TOOL, PROBE CLEANING METHOD AND SEMICONDUCTOR WAFER TESTING METHOD

[75] Inventor: Masaharu Mizuta, Tokyo, Japan

[73] Assignee: Mitsubishi Denki Kabushiki Kaisha, Tokyo, Japan

[21] Appl. No.: 09/041,969

[22] Filed: Mar. 13, 1998

[30] Foreign Application Priority Data

Sep. 3, 1997 [JP] Japan ..................................... 9-238221

[51] Int. Cl.⁷ ............................. B24B 19/00; B24D 15/04
[52] U.S. Cl. ............................................. 451/59; 451/533
[58] Field of Search ........................ 451/59, 533; 15/218, 15/218.1, 220.4, 244.4, 244.1, 229.11, 229.12

[56] References Cited

U.S. PATENT DOCUMENTS

| | | | |
|---|---|---|---|
| 1,652,875 | 12/1927 | Rein | 15/220.4 |
| 4,361,926 | 12/1982 | Brush et al. | 15/246 |
| 4,547,923 | 10/1985 | DeVries et al. | 15/218.1 |
| 4,590,422 | 5/1986 | Milligan | 451/28 |
| 5,016,401 | 5/1991 | Mangus | 451/533 |

FOREIGN PATENT DOCUMENTS 7-244074 9/1995 Japan .

*Primary Examiner*—Robert A. Rose
*Attorney, Agent, or Firm*—McDermott, Will & Emery

[57] ABSTRACT

A probe cleaning tool including an abrading member for scraping foreign material adhering to an end portion of a probe, made of a mixture of an elastic base material and abrasive particles, and a dust removing film attached to a surface of the abrading member. The dust removing film removes foreign material adhering to the end portion of the probe when the end portion is stuck into and extracted from the probe cleaning tool. The foreign material scraped off the end portion of the probe are confined in the probe cleaning tool and the end portion of the probe can be completely cleaned.

10 Claims, 6 Drawing Sheets

PROBE CLEANING TOOL, PROBE CLEANING METHOD AND SEMICONDUCTOR WAFER TESTING METHOD

FIELD OF THE INVENTION

The present invention relates to a probe cleaning tool for cleaning an end portion of a probe, a probe cleaning method and a semiconductor wafer testing method. More particularly, the present invention relates to a probe cleaning tool comprising an abrading member and a dust removing film.

BACKGROUND ART

Generally, a method of fabricating an integrated circuit device (hereinafter, referred to as IC) or an LSI device includes a wafer testing process for testing IC chips formed in a wafer to determine whether or not the IC chips are acceptable. In the wafer testing process, in general, a probe card is mounted on a device called a prober, and a probe included in the probe card are brought into contact with predetermined pads (electrodes) formed on the chips of the wafer. More specifically, electrical connection of the prober and the pad is achieved by applying a predetermined pressure (hereinafter referred to as "needle pressure") to the probe after the probe has been brought into contact with the pad for overdriving so that the probe penetrates an aluminum oxide film forming the surface of the pad and comes into low-resistance contact with an aluminum portion forming the body of the pad.

When the needle pressure is applied to the probe to bring the probe into contact with the aluminum portion of the pad, foreign matters including aluminum oxide chips adhering to the chip and the probe obstruct the electrical connection. Various measures have been taken to prevent problems in achieving the electrical contact.

The probe for the electrical testing of a semiconductor wafer is cleaned periodically by using an abrading pad or an abrasive sheet to remove foreign materials which are scraped off of the pads of ICs and adhere to an end portion of the probe. Abrasive pads composed of a mixture of an elastic base material and abrasive particles are disclosed in JP-A No. 7-244074 (Registration No. 2511806) and JP-A No. 56-119377. Foreign materials adhering to the end portion of the probe are scraped off the end portion by repeating a cleaning cycle of sticking or pressing and extracting the end portion of the probe against a probe cleaning tool to maintain the end portion of the probe in a good shape.

FIG. 6 is an enlarged sectional view illustrating the interaction between an end portion 20 of a probe, an abrasive pad 40 and foreign material adhering to the end portion 20. The end portion 20 of the probe consists of a substantially spherical round tip 21 and a conical section 22 smoothly merging into the round tip 21.

In FIG. 6, a1 indicates the condition of the end portion 20 before being subjected to a cleaning operation in which the sticking-and-extracting cleaning cycle is repeated, a2 indicates the condition of the end portion 20 as it is stuck into the abrasive pad 40, and a3 indicates the condition of the end portion 20 after it has it has been extracted from the abrasive pad 40 after the completion of the cleaning operation.

The abrasive pad 40 shown in FIG. 6 is formed by mixing an elastic base material 41 and abrasive particles 42 (abrasive grains). There are some cases where the base material 41 and the abrasive particles 42 are worn and fall off the abrasive pad 40 to produce additional foreign material when the sticking-and-extracting cleaning cycle is repeated.

The condition of foreign material adhering to the end portion 20 of the probe in the states a1, a2 and a3 will be explained. FIG. 6 depicts primary foreign material 101 such as aluminum oxide chips, adhering to the end portion 20 of the probe during the wafer testing process, and secondary foreign material 102, such as particles of silicone rubber and abrasive grains, produced during the cleaning process.

In the state a3 after the completion of a cleaning operation in which the sticking-and-extracting cleaning cycle is repeated, the foreign materials 101 and 102 have been removed from the round tip 21 of the end portion 20 of the probe, and the foreign materials 101 and 102 once removed from the end portion 20 have adhered again to the conical section 22 of the end portion 20 of the probe. All the foreign materials 101 and 102 adhering to the conical section 22 of the end portion 20 can be removed to complete the cleaning operation by blowing an organic solvent against the end portion 20 of the probe and blowing dry air against the end portion 20 of the probe.

When carrying out the conventional probe cleaning method by using the conventional abrasive pad 40, a problem arises when extracting the end portion 20 of the probe stuck into the abrasive pad 40 from the abrasive pad 40. When the end portion 20 of the probe is extracted from the abrasive pad 40, chips of the pads of the IC once scraped off the end portion 20 of the probe adhere again to the end portion 20, and secondary foreign material, such as particles produced from the worn base material 41 and the abrasive particles 42 of the abrasive pad 40, adhere to the end portion 20 of the probe. Therefore, an additional cleaning operation using an organic solvent is necessary to clean the end portion 20 perfectly.

SUMMARY OF THE INVENTION

The present invention has been made to solve the problem discussed above, and it is therefore a first object of the present invention to provide a probe cleaning tool capable of completely removing foreign material from an end portion of a probe without leaving any foreign material on the end portion of the probe when the end portion of the probe stuck into the probe cleaning tool is extracted from the probe cleaning tool.

A second object of the present invention is to provide an improved probe cleaning method which does not produce additional foreign material in a cleaning operation in which a sticking-and-extracting cleaning cycle is repeated.

A third object of the present invention is to provide a semiconductor wafer testing method including the foregoing probe cleaning method employing the foregoing probe cleaning tool.

According to one aspect of the present invention, a probe cleaning tool, for cleaning an end portion of a probe for testing a semiconductor wafer, comprises an abrading member into which the end portion of the probe is stuck to scrape off foreign material adhering to the end portion of the probe, and a dust removing film formed over a surface of the abrading member to remove foreign material adhering to the end portion of the probe when the end portion of the probe is extracted from the abrading member.

In the probe cleaning tool, the dust removing film has preferably a property to be penetrated by the end portion of the probe, when a pressure lower than a test pressure at which the top of the probe is applied to a semiconductor wafer for testing.

In the probe cleaning, the dust removing film has preferably a strength sufficient to prevent the dust removing film from being broken by foreign material adhering to the end portion of the probe when the end portion of the probe is extracted from the abrading member.

In the probe cleaning tool, the dust removing film is preferably an aluminum film.

In the probe cleaning tool, the abrading member has preferably a layer of a mixture of an elastic resin as a base material, and abrasive particles.

According to another aspect of the present invention, in probe cleaning method, a sticking-and-extracting cleaning cycle is repeated a plurality of times in which the end portion of the probe is stuck into and extracted from the probe cleaning tool as defined above.

According to another aspect of the present invention, in a semiconductor wafer testing method, included is a step of cleaning an end portion of a semiconductor wafer testing probe by the method, as defined above, of cleaning an end portion of a probe.

Other and further objects, features and advantages of the invention will appear more fully from the following description.

BEST MODE OF CARRYING OUT THE INVENTION

Figure 1:
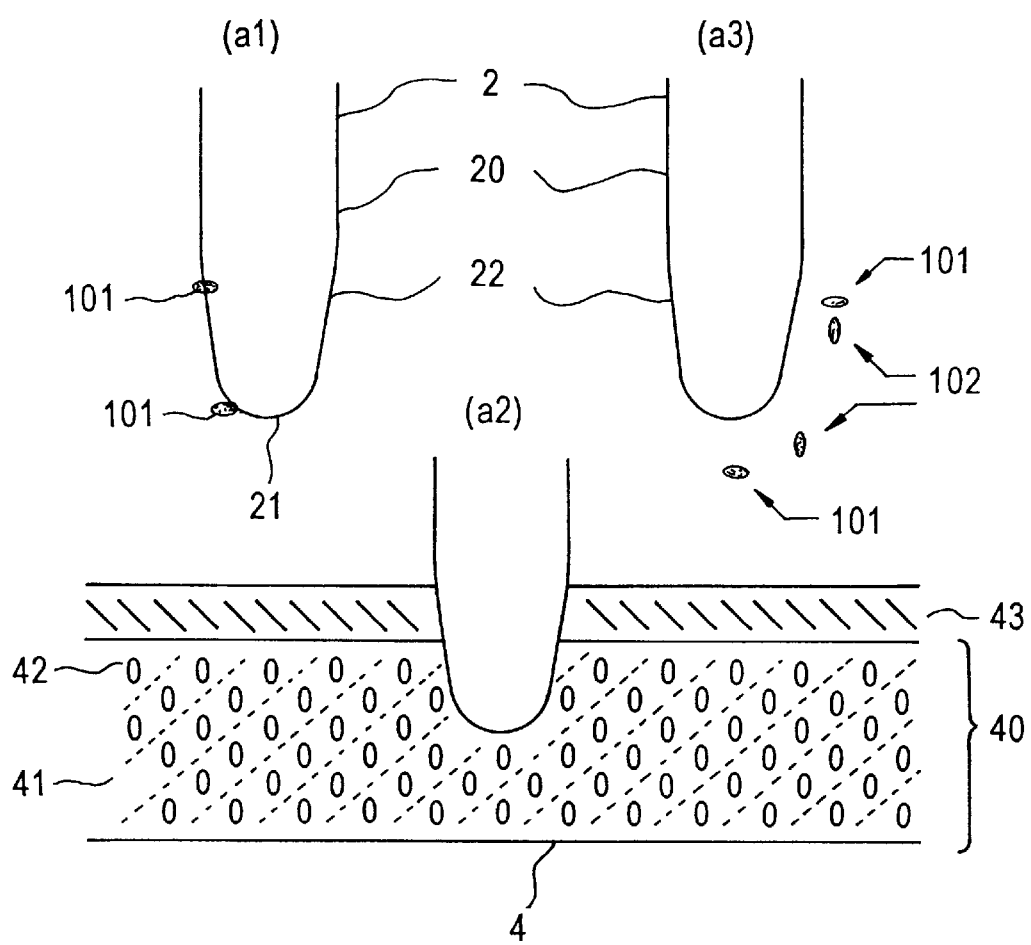
FIG. 1 shows a probe cleaning tool and a cleaning operation for cleaning an end portion of a probe according to a first embodiment of the present invention.

Preferred embodiments of the present invention will be described hereinafter with reference to the accompanying drawings, in which the same or like parts are designated by the same reference characters.

First Embodiment

FIG. 1 is an exemplary diagram of a probe cleaning tool and a cleaning operation for cleaning an end portion of a probe by using the same probe cleaning tool in a first embodiment according to the present invention.

Referring to FIG. 1, a probe 2 is a tungsten needle held in a cantilever fashion. The probe 2 has an end portion 20 consisting of a substantially spherical round tip 21 and a substantially conical section 22 merging into the round tip 21.

An abrasive pad 40 is made of a mixture of an elastic base material 41, such as silicone rubber, and abrasive aluminum particles 42. A dust removing film 43 is attached adhesively to a surface of the abrasive pad 40 to form a probe cleaning tool 4 in a first embodiment according to the present invention.

The dust removing film 43 must allow the end portion 20 of the probe 2 to penetrate therethrough when a pressure lower than a needle pressure to be exerted on the tip of the probe 2 is exerted on the tip of the probe 2 during a cleaning operation, and must not be damaged by a rubbing action of the end portion 20 of the probe 2 exerted thereon and by a colliding action of foreign material adhering to the end portion 20 of the probe 2 exerted thereon.

Even if secondary foreign material, such as fine particles of worn base material 41 and fallen abrasive particles 42 produced by the repetition of the sticking-and-extracting cleaning cycle, are produced, the probe cleaning tool 4 is required to confine therein primary foreign material removed from the end portion 20 of the probe 2 and secondary foreign material so that those foreign materials may not be discharged outside from the dust removing film 43.

Necessary physical properties of a desirable material for forming the dust removing film 43 were examined, and it was decided to use an aluminum film of about 15 $\mu$m in thickness as the dust removing film 43. The aluminum film may be an aluminum foil adhesively attached to the surface of the abrasive pad 40 or an aluminum film deposited on the surface of the abrasive pad 40 by evaporation.

Actions of the probe cleaning tool 4 in the first embodiment according to the present invention will be described hereinafter with reference to FIG. 1. In FIG. 1, al indicates the condition of the end portion 20 before a cleaning operation in which the sticking-and-extracting cleaning cycle is repeated, a2 indicates the condition of the end portion 20 as it is stuck into the abrasive pad 40, and a3 indicates the condition of the end portion 20 after it has been extracted from the abrasive pad 40 after the completion of the cleaning operation.

Primary foreign material 101, such as aluminum oxide particles, fell off the pads of an IC chip during a wafer testing operation and adhered to the end portion 20 of the probe 2, and secondary foreign material 102 produced by sticking the end portion 20 of the probe 2 into and extracting the end portion 20 of the probe 2 from the abrasive pad 40, such as fine particles of worn base material 41, i.e., silicone rubber, and fallen abrasive particles 42, i.e., alumina particles.

Figure 6:
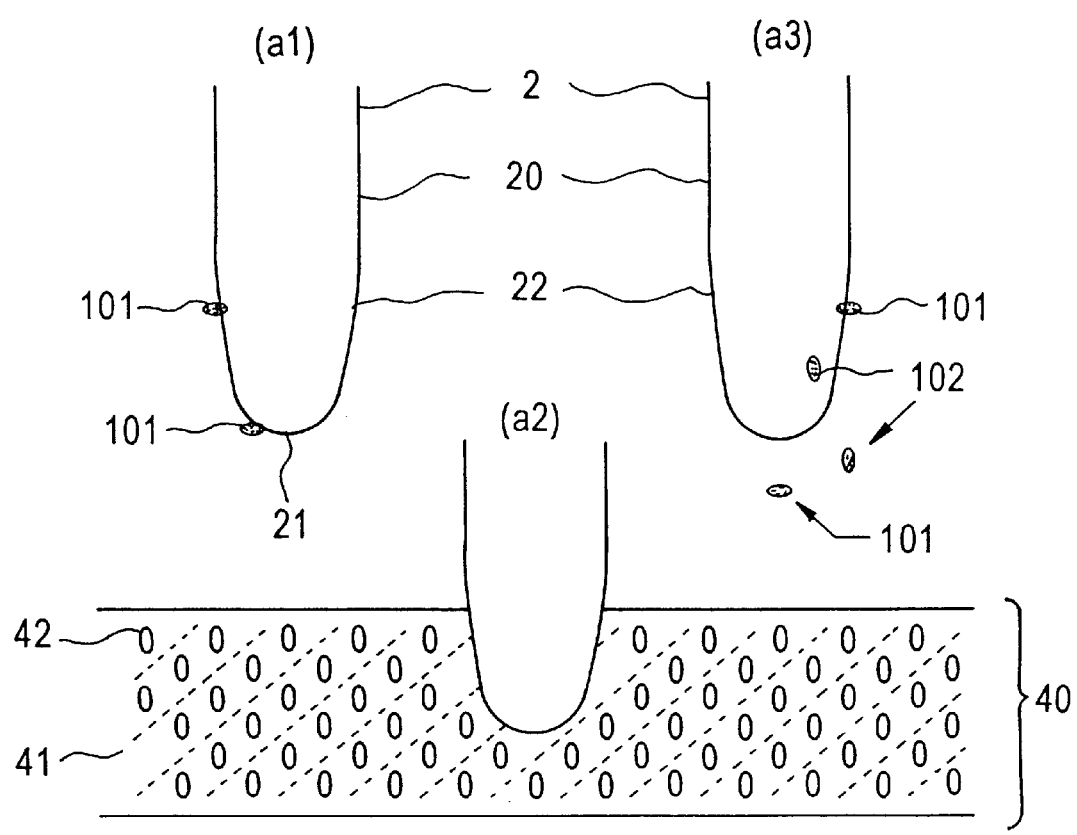
FIG. 6 is a partial sectional view illustrating an end portion of a probe and a probe cleaning tool in the conventional art.

As shown in FIG. 1, in the state a3 where the end portion 20 has been extracted from the abrasive pad 40 after the completion of the cleaning operation, the primary foreign material 101 have been removed from the round tip 21 and the conical section 22 of the end portion 20 of the probe 2, and the secondary foreign material 102 produced during the cleaning operation do not remain on the conical section 22 of the end portion 20 of the probe 2. Thus, all the foreign material can be completely removed. In contrast, as mentioned previously in connection with FIG. 6, it is particularly difficult to clean the conical section 22 of the end portion 20 of the probe 2 by the conventional probe cleaning tool using only the abrasive pad 40.

The use of an aluminum film as the dust removing film 43 forming the surface of the probe cleaning tool 4 makes the detection of the moment when the tip of the probe 20 comes into contact with the probe cleaning tool 4 possible, which can be applied to the management of correcting irregularity at the moment when the tips of a plurality of probes come into contact with the pads of an IC chip.

Second Embodiment

Figure 2:
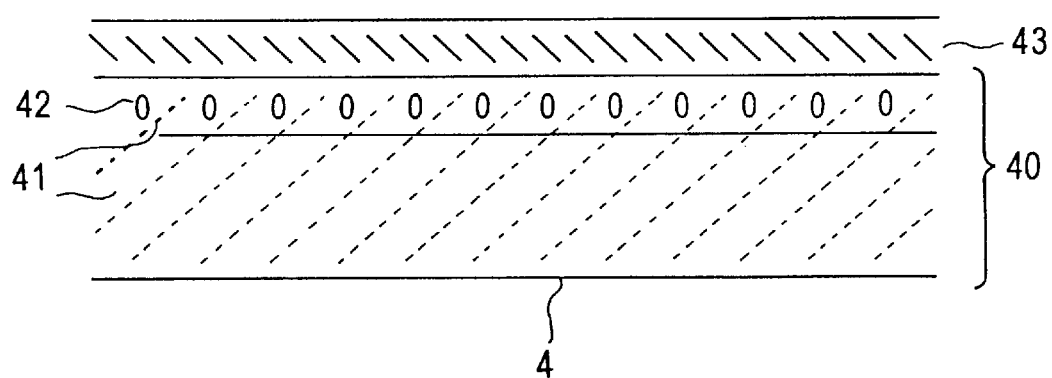
FIG. 2 is a fragmentary sectional view of a probe cleaning tool according to a second embodiment of the present invention.

FIG. 2 is a fragmentary sectional view of a probe cleaning tool 4 of a second embodiment according to the present invention. Referring to FIG. 2, an abrasive pad 40 is of a two-layer construction consisting of a thick base layer of an elastic base material 41, and a thin abrasive layer of a mixture of the elastic base material 41 and abrasive particles 42, such as tungsten carbide particles. A dust removing film 43 is attached to a surface of the thin abrasive layer of the abrasive pad 40 to complete the probe cleaning tool 4.

The end portion 20 of the probe 2 is able to penetrate the dust removing film 43 by applying a pressure lower than a needle pressure applied thereto when testing a semiconductor wafer. The dust removing film 43 is an aluminum film of about 10 in thickness which is not broken by foreign materials which collide against the dust removing film 43 when the end portion 20 of the probe 2 stuck into the abrasive pad 40 is extracted.

FIG. 2 depicts the second embodiment of the present invention. The probes that can be cleaned by the probe cleaning tool 4 need not be limited to cantilever probes like those shown in FIG. 1, and may be vertical probes, cobra probes, L-type probes and plunger probes which are employed in an in-circuit tester. The sticking-and-extracting cleaning cycle using the cleaning tool 4 is repeated a plurality of times to clean the probe.

The cleaning operation using the probe cleaning tool 4 in the second embodiment of the present invention is the same or similar to that using the cleaning tool 4 in the first embodiment previously described with reference to FIG. 1. After the completion of the cleaning operation, the primary foreign materials 101 have been removed from the round tip 21 and the conical section 22 of the end portion 20 of the probe 2, and the secondary foreign materials 102 produced during the cleaning operation do not remain on the conical section 22 of the end portion 20 of the probe 2.

Third Embodiment

Figure 3A:
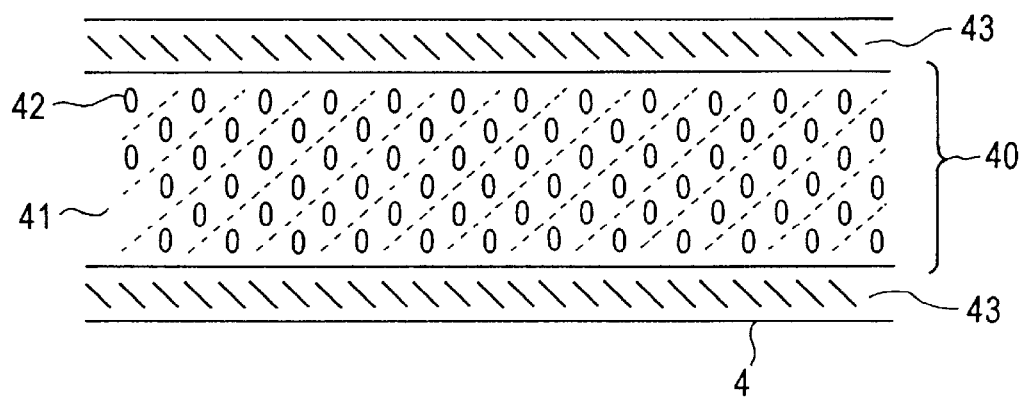
FIG. 3(a) is a sectional view of a probe cleaning tool according to a third embodiment of the present invention.
Figure 3B:
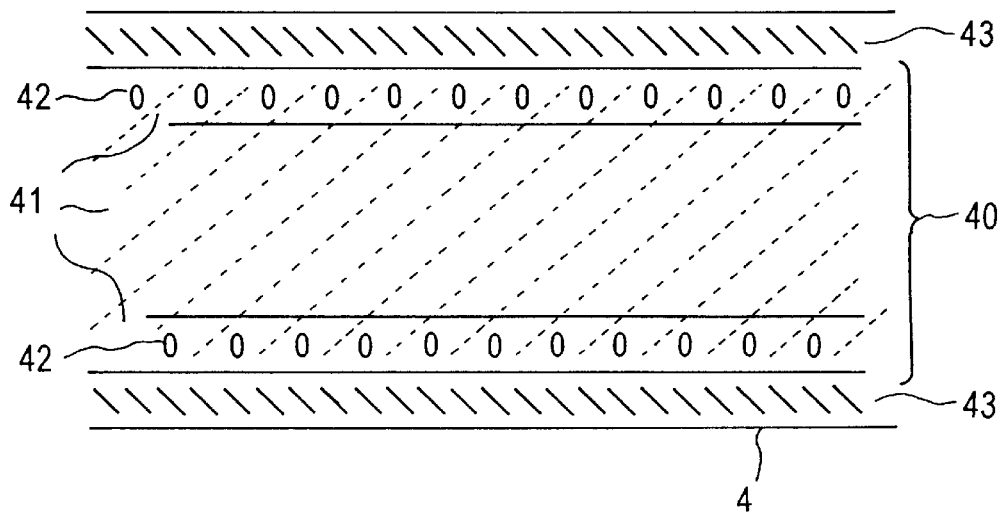
FIG. 3(b) shows a probe cleaning tool in a modification of the probe cleaning tool of FIG. 3(a).

FIG. 3(*a*) is a sectional view of a probe cleaning tool 4 in a third embodiment according to the present invention, and FIG. 3(*b*) shows a probe cleaning tool 4 which is a modification of the probe cleaning tool 4 of FIG. 3(*a*).

In FIG. 3(*a*), an abrasive pad 40 is made, similarly to the abrasive pad 40 of the probe cleaning tool 4 shown in FIG. 1, of a mixture of an elastic base material 41, such as silicon rubber, and abrasive particles 42, such as alumina particles. Dust removing films 43 are attached adhesively to the opposite surfaces of the abrasive pad 40 to complete a probe cleaning tool 4.

In FIG. 3(*b*), the abrasive pad 40 includes a thick layer made of an elastic base material 41, such as an elastic urethane resin, and two thin abrasive layers made of a mixture of the base material 41 and abrasive particles 42, such as tungsten carbide particles. And, dust removing films 43 are bonded to the outer surfaces of the thin abrasive layers of the abrasive pad 40 to complete a probe cleaning tool 4.

The dust removing films 43 shown in FIGS. 3(*a*) and 3(*b*) are aluminum films of about 15 in thickness formed by vacuum evaporation. The dust removing film 43 can be penetrated by an end portion of a probe using a pressure lower than a needle pressure applied to the probe when testing a semiconductor wafer and the film 43 is not broken by foreign matters which collide against the dust removing films 43 when the end portion 20 of the probe 2 stuck into the abrasive pad 40 is extracted. Thus, the dust removing film 43 prevents foreign material from being discharged outside thereof.

A cleaning operation using the probe cleaning tool 4 of the third embodiment of the present invention is the same or similar to using the cleaning tool 4 of the first embodiment previously described with reference to FIG. 1. After completion of the cleaning operation in which the sticking-and-extracting cleaning cycle is repeated, the primary foreign materials 101 are removed from the round tip 21 and the conical section 22 of the end portion 20 of the probe 2, and the secondary foreign materials 102 produced during the cleaning operation do not remain on the conical section 22 of the end portion 20 of the probe 2.

The aluminum films serving as the dust removing films 43 of the cleaning tools 4 in the first, the second and the third embodiments may be replaced with films of the materials including an aluminum alloy and nylon 6/6 as discussed above.

Desirable materials for forming the dust removing films preferably have physical properties in addition to those described in connection with the description of the first embodiment of the present invention. Young's modulus should be substantially equal to that of the pads of IC chips to be tested and far greater than that of the abrasive pad of the probe cleaning tool. A desirable Young's modulus of the dust removing films is in the range of 0.5 to 2.0 N/m2.

Fourth Embodiment

A probe cleaning method of a fourth embodiment according to the present invention employs any one of the probe cleaning tools in the first, second, or third embodiments to clean an end portion of a probe.

Figure 4:
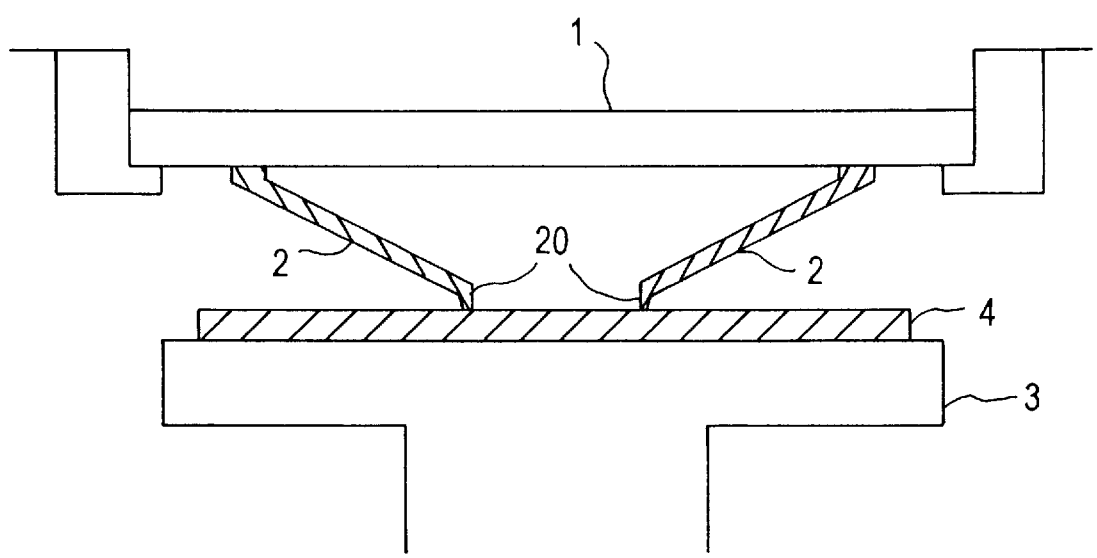
FIG. 4 illustrates the probe cleaning method according to a fourth embodiment of the present invention.

FIG. 4 illustrates the probe cleaning method in a fourth embodiment according to the present invention. Cantilever probes 2 supported on a probe card 1, and the probe cleaning tool 4 in any one of the first, second or third embodiments of the present invention fixed to a cleaning table 3 are able to move relative to each other in three-dimensional space. The probes 2 are stuck into and extracted from the probe cleaning tool 4. The probe cleaning tool 4 is an elastic pad to remove foreign material adhering to end portions 20 of the probes 2 and to confine the foreign material thus removed from the end portions 20 of the probes 2 in the probe cleaning tools 4. Consequently, the foreign material can be completely removed from the end portions 20 of the probes 2.

Probes cleaned by the probe cleaning method need not be limited to a cantilever probe like that shown in FIG. 4, and may be vertical probes, cobra probes, L-type probes and plunger probes which are employed in an in-circuit tester. The sticking-and-extracting cleaning cycle is repeated a plurality of times to clean the probe 2.

Although not illustrated specifically, the accuracy of the flatness of the surface of the abrasive sheet must properly correspond to the controlled narrow range of irregularities in height of a plurality of probes. Therefore, it is usual to attach the abrasive sheet to a surface of a panel or a silicon wafer having a high flatness.

The thickness of the cleaning tool 4 (or the abrasive sheet) is dependent on the length of the end portion of the probe to be cleaned. The thickness of the dust removing film 43, i.e., an aluminum film or the like, is determined by taking into consideration needle pressure and foreign material arresting performance as well as the shape of the probe.

Fifth Embodiment

A semiconductor wafer testing method of a fifth embodiment according to the present invention employs any one of the cleaning tools in the first, second or third embodiments or the probe cleaning method in the fourth embodiment to test a semiconductor wafer.

Figure 5:
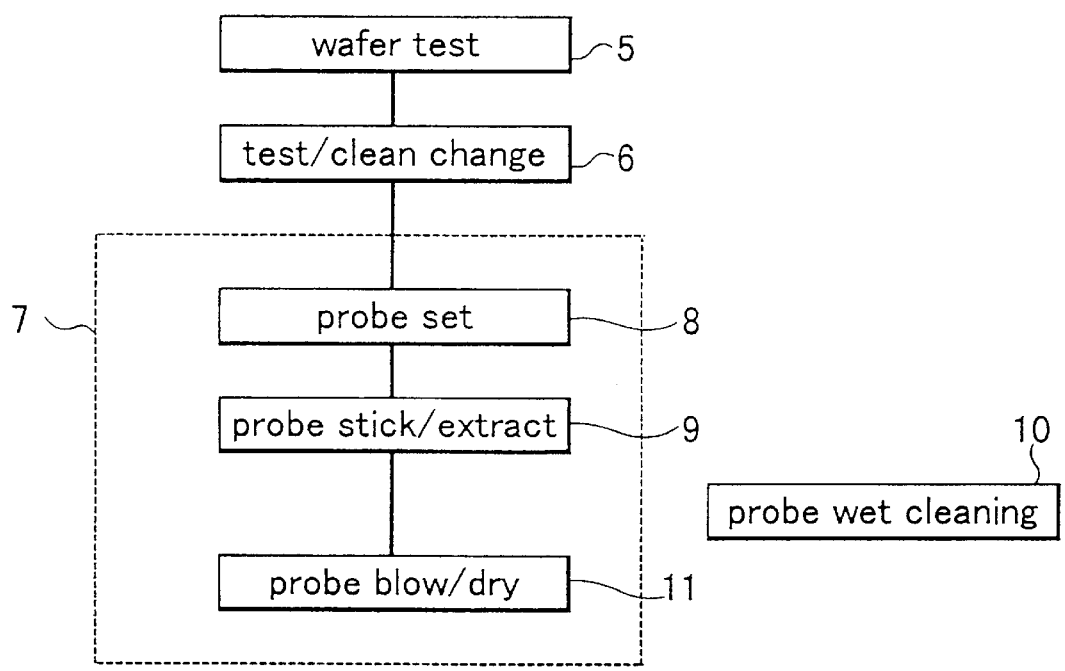
FIG. 5 is an exemplary diagram for explaining a semiconductor wafer testing method according to a fifth embodiment of the present invention.

In FIG. 5, the semiconductor wafer testing method comprises a wafer testing process 5, a testing-to-cleaning changing process 6 and a cleaning process 7. The cleaning process 7 comprises a preparatory step 8 of setting a probe 2 opposite to a cleaning tool 4 (see FIG. 4), a cleaning step 9 of carrying out the cleaning operation in which the sticking-and-extracting cycle is repeated, and a drying step 11 of blowing dry air against the probe 2. The cleaning process 7 is carried out between the successive wafer test processes 5 or once every plurality of wafer testing processes 5.

As described in connection with the first, second or third embodiments of the present invention, the primary foreign materials 101 adhering to the round tip 21 and the conical section 22 of the end portion 20 of the probe 2 are removed, and the secondary foreign materials 102 produced during the cleaning operation do not adhere substantially to the conical section 22.

Accordingly, a cleaning operation for cleaning the end portion of the probe with an organic solvent, which is an essential operation of the conventional sticking-and-extracting probe cleaning method, may be omitted. FIG. 5 shows the omission of a wet probe cleaning process 10 using an organic solvent. In the first, second, third, fourth, and fifth embodiments, the wet probe cleaning process 10 using an organic solvent may be omitted.

The present invention produces the following effects.

According to the present invention, the probe cleaning tool for cleaning an end portion of a probe comprises the abrading member which scrapes off foreign material adhering to the end portion of the probe, and the dust removing film formed over a surface of the abrading member to remove foreign material adhering to the end portion of the probe when the end portion of the probe is extracted from the abrading member. Therefore, foreign material adhering to the end portion of the probe can be completely removed from the end portion by sticking the end portion into the probe cleaning tool and extracting the same from the probe cleaning tool. Consequently, the surface of a wafer subjected to wafer testing will not be contaminated with foreign material, and faulty contact due to foreign material adhering to the pads of IC chips can be prevented.

According to the present invention, the dust removing film enables the end portion of a probe to penetrate the dust removing film, when a pressure is applied that is lower than a needle pressure applied to the end of the probe for wafer testing. Thus, the tip of the probe will not be damaged.

According to the present invention, the dust removing film is not broken by foreign material adhering to the end portion of the probe and striking on the dust removing film when the end portion of the probe is extracted from the probe cleaning tool. Thus, the foreign material adhering to the end portion of the probe can be substantially completely removed.

According to the present invention, the aluminum film having an appropriate strength and serving as the dust removing film can be easily formed, and foreign material can be effectively removed from the end portion of the probe.

According to the present invention, since the abrading member is made of a mixture of an elastic base material and abrasive particles, foreign material adhering to the end portion of the probe can be effectively scraped off the end portion.

According to the present invention, the end portion of the probe is stuck into and extracted from the probe cleaning tool provided on its surface with the dust removing film a plurality of times and, consequently, the end portion of the probe can be cleaned so that any foreign materials do not remain on the end portion of the probe. The end portion of the probe need not be washed with an organic solvent, so that the probe cleaning process can be simplified.

According to the present invention, substantially no foreign material remains on the end portion of the probe cleaned by the probe cleaning method, so that semiconductor wafers can be effectively and efficiently tested.

It is further understood that the foregoing description is a preferred embodiment of the disclosed device and that various changes and modifications may be made in the invention without departing from the spirit and scope thereof.

What is claimed is:

1. A probe cleaning tool for cleaning an end portion of a probe for testing a semiconductor wafer, comprising:
   an abrading member into which said end portion of said probe is stuck to scrape off foreign material adhering to said end portion of said probe; and
   a dust removing film formed over a surface of said abrading member to remove foreign material adhering to said end portion of said probe when said end portion of said probe is extracted from said abrading member.

2. The probe cleaning tool according to claim 1, wherein said dust removing film is capable of being penetrated by said end portion of said probe when a pressure lower than a test pressure at which the top of said probe is applied to a semiconductor wafer for testing.

3. The probe cleaning tool according to claim 1, wherein said dust removing film has a strength sufficient to prevent the dust removing film from being broken by foreign material adhering to said end portion of said probe when said end portion of said probe is extracted from said abrading member.

4. The probe cleaning tool according to claim 1, wherein said dust removing film is an aluminum film.

5. The probe cleaning tool according to claim 1, wherein said abrading member has a layer of a mixture of an elastic resin as a base material, and abrasive particles.

6. A probe cleaning method comprising the steps of:
   (a) performing a sticking-and-extracting cleaning cycle in which said end portion of said probe is stuck into and extracted from said probe cleaning tool as defined in claim 1; and
   repeating step (a).

7. A semiconductor wafer testing method comprising a step of cleaning an end portion of a semiconductor wafer testing probe by performing said probe cleaning method as defined in claim 6.

8. The probe cleaning tool according to claim 1, wherein said dust removing film is made of nylon.

9. The probe cleaning tool according to claim 1, wherein said dust removing film is made of an aluminum alloy.

10. The probe cleaning tool according to claim 1, wherein said dust removing film is made of a material with a Young's modulus in a range of between about 0.5 $N/m^2$ and about 2.0 $N/m^2$.

* * * * *